(12) United States Patent
Kataoka

(10) Patent No.: US 6,822,169 B2
(45) Date of Patent: Nov. 23, 2004

(54) FLEXIBLE PRINTED CIRCUIT BOARD AND CONNECTING METHOD THEREOF

(75) Inventor: Masahiro Kataoka, Ehime-ken (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 220 days.

(21) Appl. No.: 10/163,221

(22) Filed: Jun. 5, 2002

(65) Prior Publication Data

US 2003/0007331 A1 Jan. 9, 2003

(30) Foreign Application Priority Data

Jun. 7, 2001 (JP) ........................................ 2001-172677

(51) Int. Cl.[7] ................................................ H05K 1/00
(52) U.S. Cl. .......................... 174/254; 174/262; 29/843
(58) Field of Search ........................ 174/260, 262–266, 174/254; 361/748–751; 29/842–843

(56) References Cited

U.S. PATENT DOCUMENTS 5,821,624 A * 10/1998 Pasch ........................ 257/776
6,285,081 B1 * 9/2001 Jackson ...................... 257/738
6,414,248 B1 * 7/2002 Sundstrom .................. 174/260

FOREIGN PATENT DOCUMENTS

| JP | 04-053179 | 2/1992 |
| JP | 07-297542 | 11/1995 |
| JP | 08-032194 | 2/1996 |
| JP | 09-148732 | 6/1997 |
| JP | 10-075029 | 3/1998 |

* cited by examiner

Primary Examiner—Kamand Cuneo
Assistant Examiner—Jeremy Norris
(74) Attorney, Agent, or Firm—RatnerPrestia

(57) ABSTRACT

A flexible printed circuit board ("FPCB") that has a through hole in the pattern layer between the cover layer and base layer, the diameter of the through hole in the pattern layer of FPCB is smaller than that of the holes in the cover layer and the base layer of another printed circuit board ("PCB"). The holes in the cover layer and base layer are oriented toward the solder land part of the FPCB. The difference in diameter increases the connecting area for soldering a FPCB to another PCB leading to an accurate and strong solder.

8 Claims, 10 Drawing Sheets

US 6,822,169 B2

FLEXIBLE PRINTED CIRCUIT BOARD AND CONNECTING METHOD THEREOF

FIELD OF THE INVENTION

The present invention relates to a flexible printed circuit board and its connecting method to another printed circuit board by soldering.

BACKGROUND OF THE INVENTION

In JP Patent Publication No. H07-29/542, a method for connecting a flexible printed circuit board (hereinafter referred to as "FPCB") to another printed circuit board (hereinafter referred to as "PCB") by soldering is disclosed. FIG. 10 shows this connecting method. FPCB 100 has a through hole 105 as shown in FIG. 10. (In solder land part 7) of PCB 2, protrusive solder layer 8 is formed in advance, whereto the through hole 105 of FPCB 100 is engaged. By engaging the protrusive part of the solder layer 8 with the through hole 105, both FPCB 100 and PCB 2 are aligned with each other. In this state, heating solder layer 8 higher than its melting temperature enables FPCB 100 to connect with another PCB 2.

The above connecting method however, has left the following problems because the soldering area is very small. People could not determine from the appearance whether the entire solder land part had connected completely or not to the through whole part. Therefore, time was wasted by confirming the soldering completeness between boards. Further, the connecting intensity might not always be sufficient.

SUMMARY OF THE INVENTION

In a FPCB that has a through hole in the solder land part of the pattern layer between the cover layer and the base layer, the diameter of the through hole in the pattern layer is smaller than holes in the cover layer and the base layer. The solder land part in the FPCB provides the electrical connection part of the pattern layer, which corresponds with holes in the cover layer and base layer. The difference of the diameter of the holes, leads to an increased connecting area for soldering a FPCB to a PCB providing an accurate and strong soldering connection.

DETAILED DESCRIPTION OF THE INVENTION

As to a flexible printed circuit board (hereinafter referred to as "FPCB") and its connecting method with another printed circuit board (hereinafter referred to as "PCB"), exemplary embodiments of the present invention are demonstrated with reference to the accompanying drawings. In FPCB 1, "top side" means the side of cover layer 11, and "bottom side" is regarded as the side of base layer 10. In addition, solder land part means the part of that pattern layer that is exposed, and where neither the cover layer nor base layer overlap.

A first exemplary embodiment is described hereinafter with reference to FIGS. 1, 2 and 3.

Figure 1:
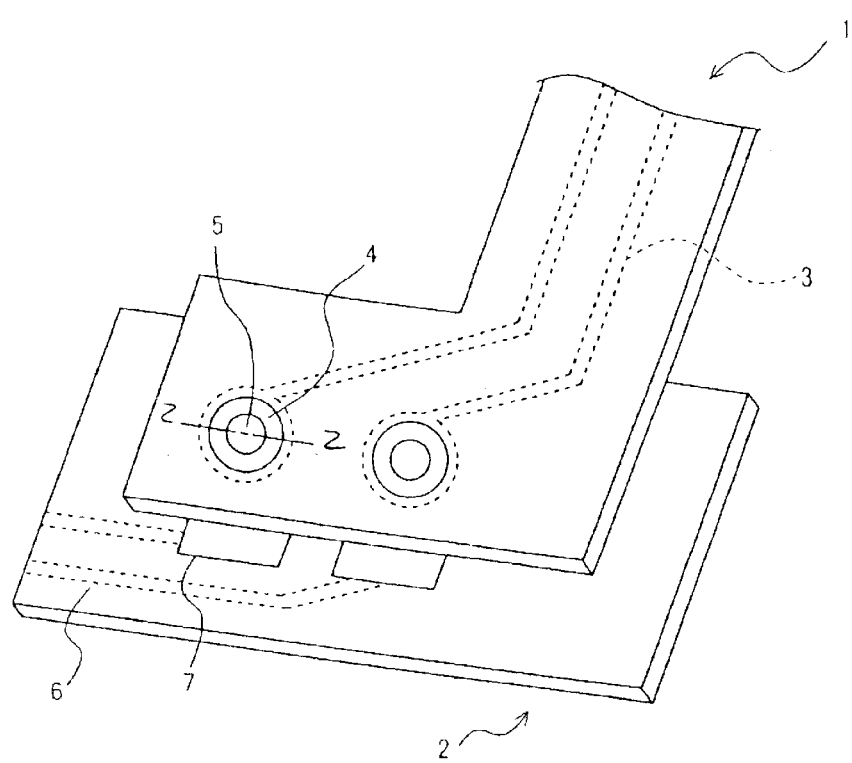
FIG. 1 is a perspective diagram of the connecting state on connecting structure of a FPCB in accordance with the first exemplary embodiment of the present invention.

FIG. 1 is a perspective diagram that shows the state of both the FPCB and the PCB on a connecting structure. FIG. 2 is an enlarged cross sectional view before soldering in line 2—2 of FIG. 1. In FIG. 2, FPCB 1 and PCB 2 overlap. FPCB 1 comprises a flexible isolated film 10 (hereinafter called base layer 10), solder land part 4 and pattern layer 3 that are formed by predetermined pattern of circuit conductor, and cover layer 11, wherein pattern layer 3 is sandwiched between base layer 10 and cover layer 11. The pattern layer extends beyond at least the base layer, cover layer or both. Comparatively, PCB 2 comprises a cover layer 13 at the top and pattern layer 6 that are formed by a predetermined pattern of circuit conductor on base board 15 covered with isolated film 14. Solder land part 7 is the exposed part of the pattern layer 3 where cover layer 13 does not overlap the pattern layer 3. FPCB 1 and PCB 2 are connected as exemplified in FIG. 1 by melting each solder with heat applied to solder land parts 4 and 7. In addition, a rigid or a flexible circuit board is appropriate as a PCB 2.

Figure 2:
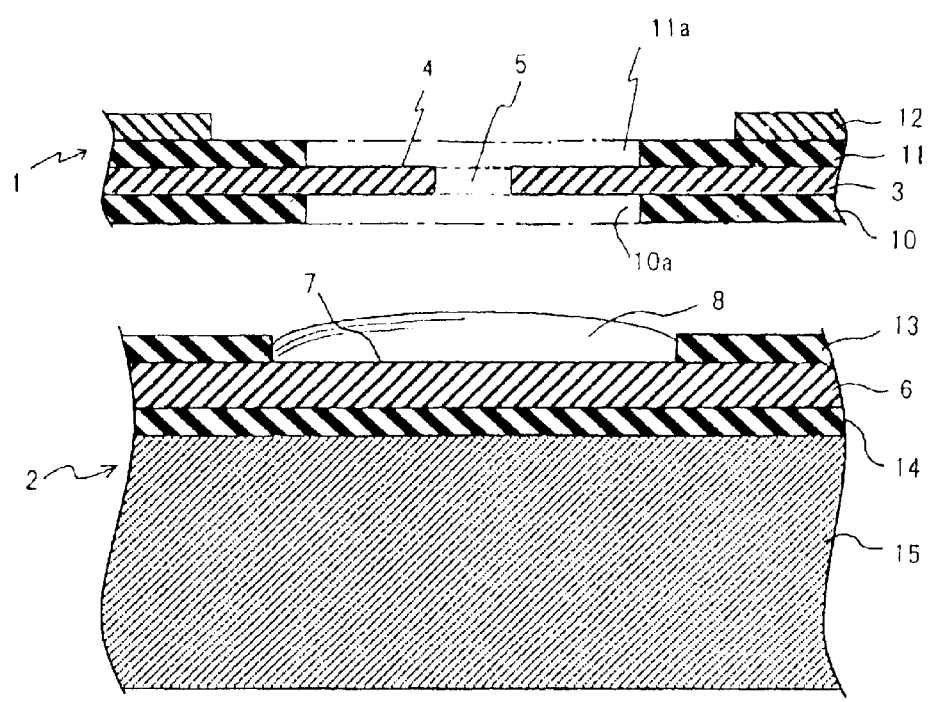
FIG. 2 is an enlarged cross sectional view before soldering in line 2—2 of FIG. 1.
Figure 3:
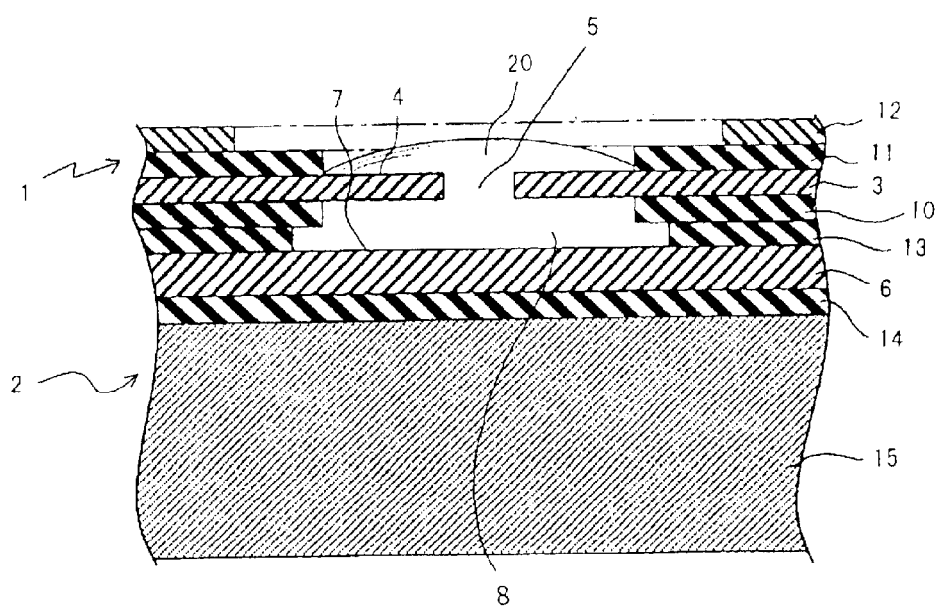
FIG. 3 is an enlarged cross sectional view after soldering in line 2—2 of FIG. 1.

As shown in FIG. 2, a known solder resistant cover layer 111 and 13 covers the other part of each solder land parts 4 and 7 in pattern layer 3 and 6. Solder resistant means that solder will not adhere to the cover layer. Further, hole 5 is set in the center of solder land part 4 of the FPCB 1. The diameter of through hole 5 is smaller than holes 10a and 11a of cover layer 11 and base layer 10 respectively. Furthermore, suspension layer 12 is formed with a plastic film or a stainless steel film to flexibly support the board on outermost side of FPCB 1. Protrusive solder layer 8 is formed in advance on solder land part 7 of PCB 2 in correspondence with solder land part 4 in FPCB 1.

A method for connecting FPCB 1 and PCB 2 is described as follows. First, FPCB 1 and PCB 2 are positioned so that protrusive solder layer 8 on PCB 2 engages through hole 5 of solder land part 4 in FPCB 1. Heating for example by electromagnetic induction, solder layer 8 in this state higher than the solder melting temperature, enables both boards to connect. That is to say, a connection is made when part of solder layer 8 of PCB 2 flows between through hole 5 in solder land part 4 in FPCB 1 forming solder layer 20 as shown in FIG. 3. As a result, solder land part 4 in FPCB 1 is surrounded by solder 20, and soldering is complete.

Figure 10:
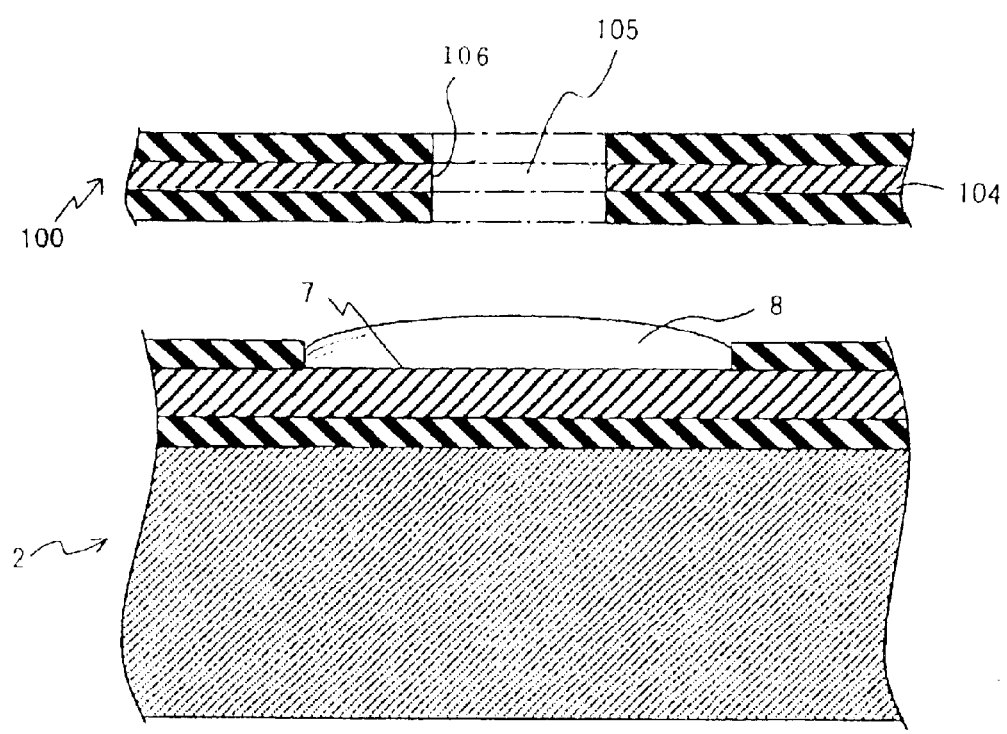
FIG. 10 is an enlarged cross sectional view before soldering in accordance with the conventional invention.

As shown in FIG. 10, the connecting area in a conventional structure of FPCB forms only a small face of a cut end 106 of a through hole 105 in solder land part 104. Although it is possible to put solder 8 on cover layer part, conventional methods have problems of weak soldering intensity. The first exemplary embodiment of the present invention improves such conventional problems and provides a connecting structure that has a larger soldering area in solder land part 4 for catching solder 20 as indicated in FIG. 3. Thus, the connecting intensity of the present invention increases much more than that of the conventional method and it can be easier to confirm the soldering completeness by observing if the solder overflowed onto the solder land part of FPCB 1.

In using minute patterns of FPCB, an additive process is often adopted, where a base layer, pattern layer, and cover layer are laminated sequentially. When a miniature circuit pattern is produced, more problems occur as to the connecting intensity to another PCB.

In order to solve problems of connecting intensity, it is effective to increase the soldering connecting area of the FPCB. Namely, the diameter of hole 10a and hole 11a set in base layer 10 and cover layer 11 is formed to be larger than that of through hole 5. The increased diameter of hole 10a provides a larger connecting area and leads to strong connection.

One example of a FPCB comprising a 10 μm thick base layer, 10 μm thick pattern layer (copper layer), and 5 μm thick cover layer, that is, 25 μm thick of stainless layer is shown. In such a FPCB, the diameter of the through hole in the solder land part of the pattern layer is 250 μm, and the diameter of the holes in each cover layer and base layer is 400 μm. The ratio between diameter of the through hole and the holes is the quotient of 400/250 or 1.6. A value of this degree is appropriate in dealing with minute patterns of FPCB, because both boards can be connected strongly. When the ratio is larger, the strength of the solder connection weakens, even though the connecting surface area for soldering increases.

The relationship of the through hole and the holes formed by the base layer and cover layer can also be described in terms of the length of the overlap between the pattern layer and base or cover layer. In the above example, the pattern layer would extend 75 μm beyond the base layer and cover layer. The pattern layer length determines the amount of connecting surface area for the solder.

A second exemplary embodiment is described hereinafter with reference to FIGS. 4 and 5.

Figure 4:
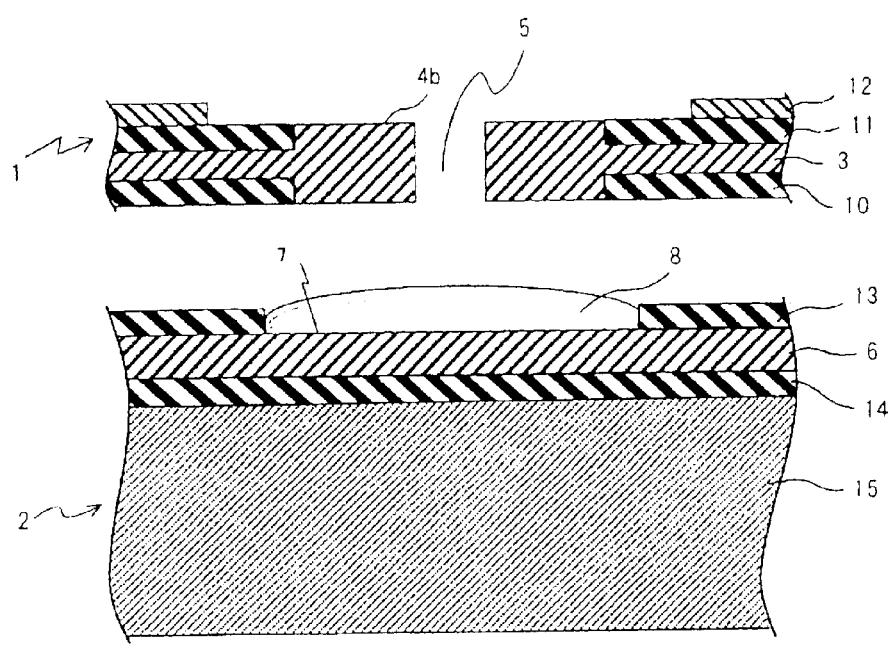
FIG. 4 is an enlarged cross sectional view before soldering in accordance with one description of the second exemplary embodiment of the present invention.
Figure 5:
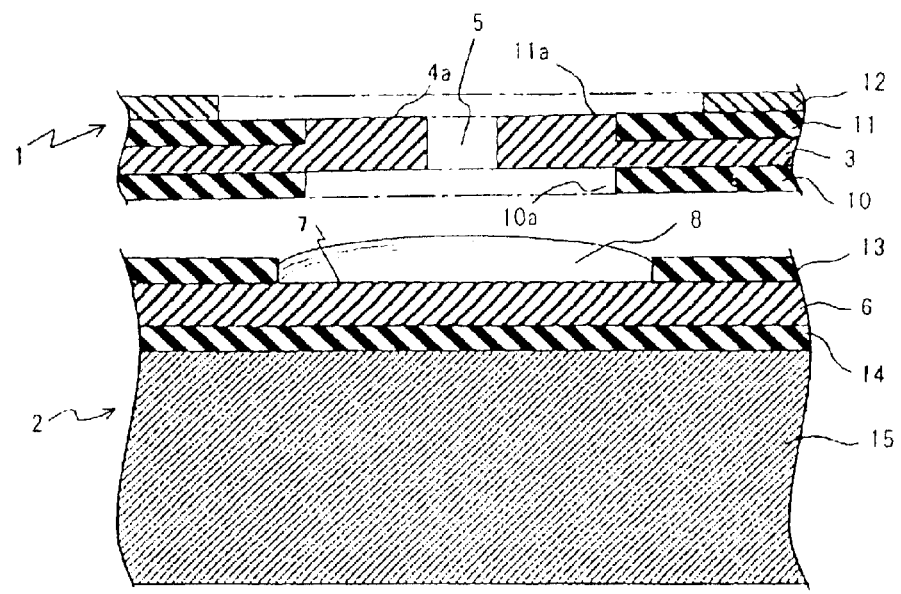
FIG. 5(A) is an enlarged cross sectional view before soldering in accordance with another description of the second exemplary embodiment of the present invention.
FIG. 5(B) is an enlarged cross sectional view before soldering in accordance with another description of the second exemplary embodiment of the present invention.
Figure 5:
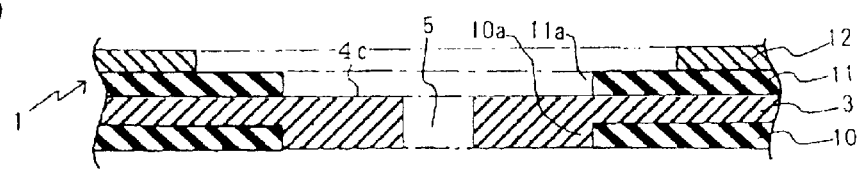

FIG. 4 is a cross sectional view to show both a FPCB and a PCB connected by the connecting structure and a method in accordance with the second exemplary embodiment of the present invention.

With regard to the connecting structure of the FPCB, in FIG. 4 only the shape of solder land part 4b in FPCB 1 differs from that of solder land part 4 of the first embodiment. Therefore, as to the same structure and method presented in the first embodiment, a detailed explanation is omitted and the same reference numbers are used.

As shown in FIG. 4, the pattern layer 3 in the solder land part 4b in FPCB 1 in the second embodiment is thicker than the pattern layer 3. The total thickness of the pattern layer in the solder land part 4b is equal to that of total of three layers: the base layer 10, the pattern layer 3, and the cover layer 11.

Regarding conventional structure for making a double-sided electrode which comprises a pattern layer on both sides of a base layer, a double-layer PCB was produced by folding a single-layer FPCB. Another way, a double-sided FPCB with two pattern layers was used. Because a double-sided electrode is comprised by using both the top and bottom side of single pattern layer, a structure with double connecting surfaces in single pattern layer of FPCB can be produced. Namely, this process leads to an inexpensive double-sided electrode by using a single pattern layer of FPCB. In addition, when compared to conventional examples in which the folded single layer FPCB or the double-sided FPCB are used, it is clear that thinner and lighter FPCB can be manufactured using this technique.

According to the connecting structure of FIG. 4 in the second embodiment, the bottom side of solder land part 4b and base layer 10 in FPCB 1 are aligned flush against the top side of cover layer 13 of PCB 2. This structure transmits heat smoothly to solder layer 8 in PCB 2 through solder land part 4b for connecting. Thus, thick solder land part 4b conducts heat efficiently Bonding by thermo compression saves time and stabilizes the connection.

FIGS. 5(A) and 5(B) show another connecting structure from FIG. 4 regarding the second embodiment of the structure in FPCB 1. In FIG. 5(A), the thickness of the pattern layer in the solder land part 4a may be equal to the total thickness of pattern layer 3 plus the cover layer 11, wherein top side of solder land part 4a is part of the same surface of cover layer 11. Alternatively, as in FIG. 5(B), the thickness of the pattern layer in the solder land part 4c may be equal to the total thickness of pattern layer 3 plus base layer 10, wherein bottom side of solder land part 4c is part of the same surface of base layer 10. Both structures shown in the structures FIGS. 5(A) and 5(B) can also expect similar effects as FIG. 1.

A third exemplary embodiment is described hereinafter with reference to FIGS. 6, 7, 8, and 9.

Figure 6:
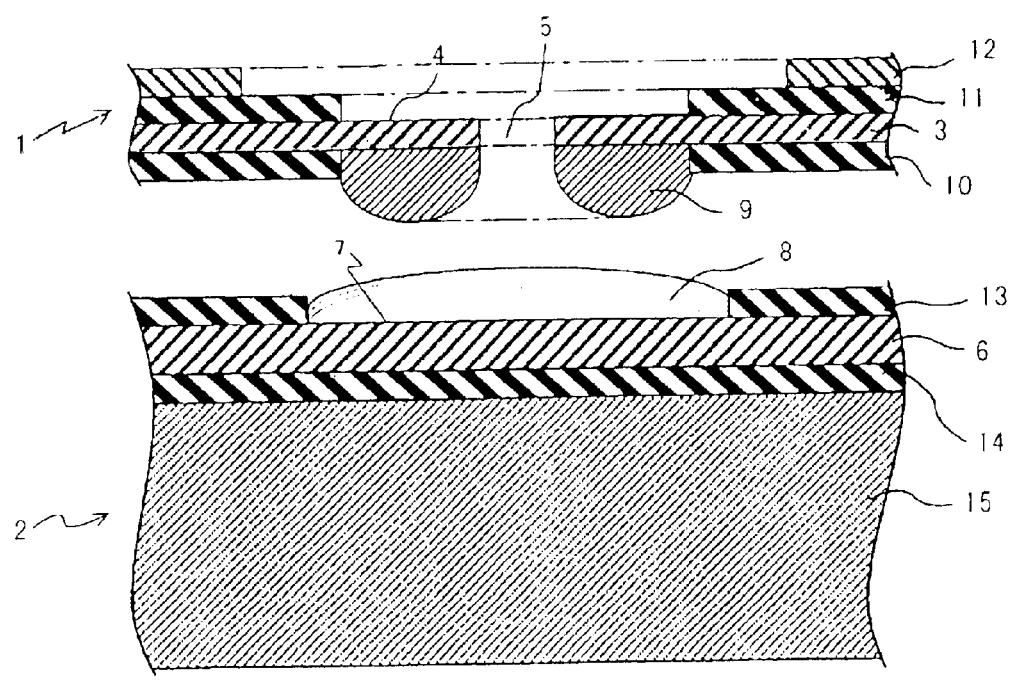
FIG. 6 is an enlarged cross sectional view before soldering in accordance with one description of the third exemplary embodiment of the present invention.

FIG. 6 is a cross sectional view of the FPCB and PCB on a connecting structure and method in accordance with the third exemplary embodiment of the present invention.

With regard to the connecting method of both boards, the third embodiment is different from the first embodiment as to the form of solder layer 9 on solder land part 4 in the FPCB as well as in the PCB. As to the same structure presented in the first embodiment, a detailed explanation is omitted and the same reference numbers are used.

Figure 7:
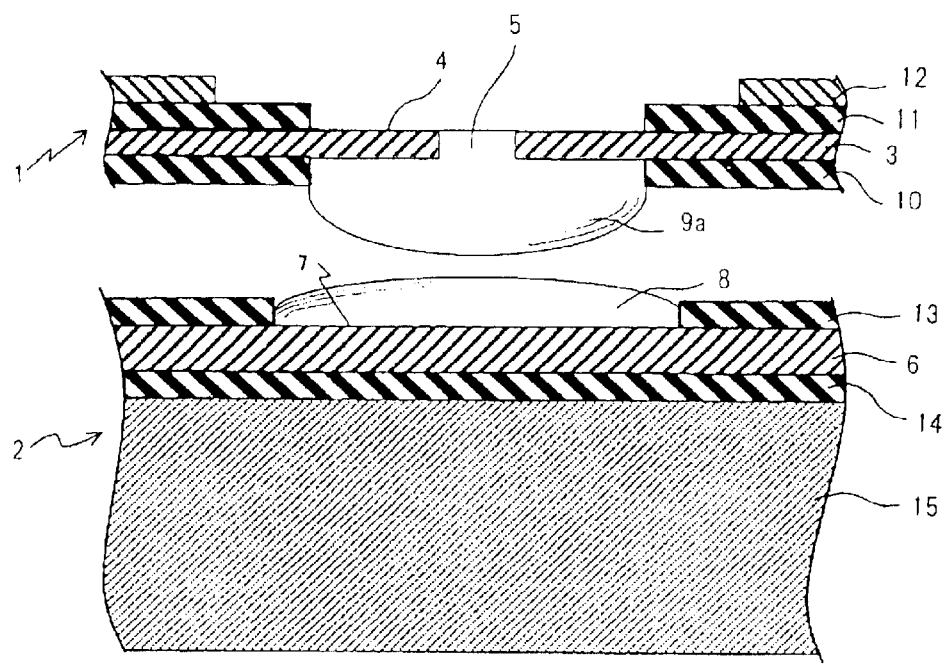
FIG. 7 is an enlarged cross sectional view before soldering in accordance with another description of the third exemplary embodiment of the present invention.

As shown in FIG. 6, a donut-shaped solder layer 9 surrounding through hole 5 on bottom side of solder land part 4 is formed in advance. It becomes possible to decide the connecting position by looking through the through hole 5. In FIG. 7, protrusive solder layer 9a is formed on bottom side of solder land part 4. In these structures, solder layer 9 and 9a are facing toward protrusive solder layer 8 in PCB 2. Namely, both boards are facing toward each other. Each protrusive solder layer sandwiched between themselves. Enough solder on both solder land parts 4 and 7 can transmit heat for connecting each other smoothly and sufficiently. As the result, a complete connecting state, shown in FIG. 3, can be obtained when enough solder spreads onto the top side of solder land part 4 through the through hole 5.

Figure 8:
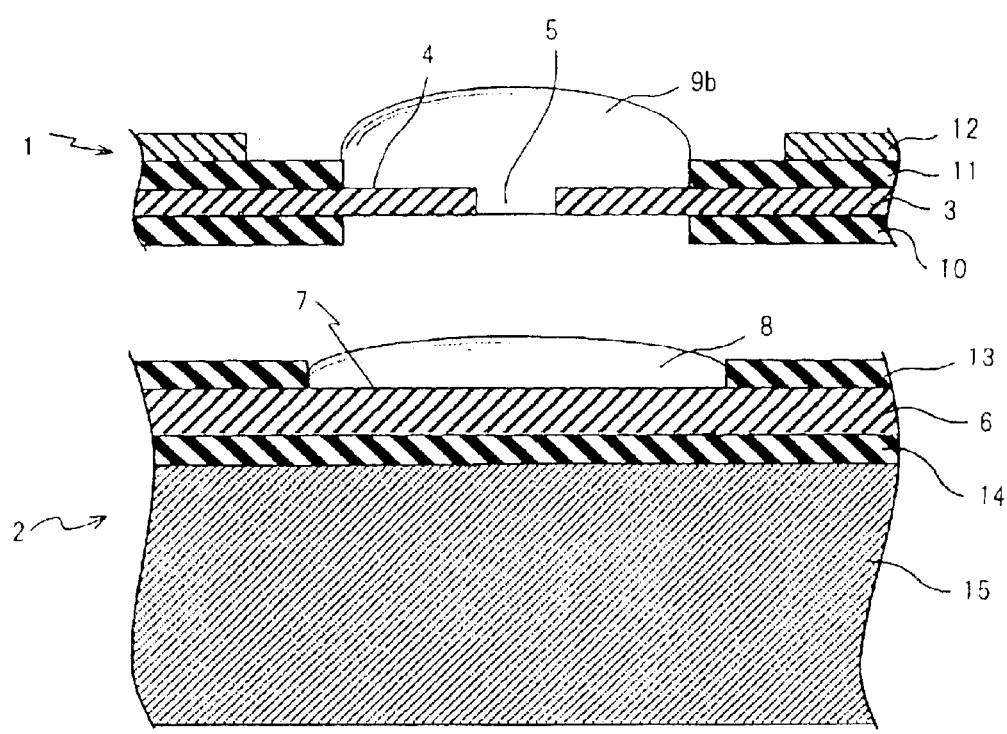
FIG. 8 is an enlarged cross sectional view before soldering accordance with another description of the third exemplary embodiment of the present invention.

FIG. 8 shows a different connecting structure, where solder layer 9b is formed in advance on the top side of solder land part 4 opposite the connecting side of PCB 2.

Figure 9:
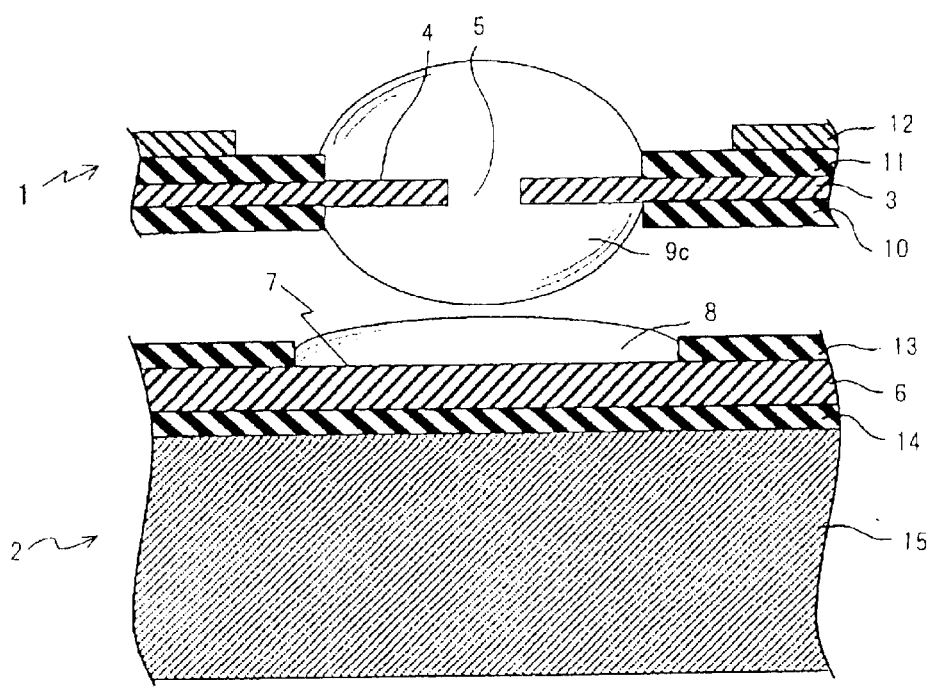
FIG. 9 is an enlarged cross sectional view before soldering in accordance with the other description of the third exemplary embodiment of the present invention.

FIG. 9 shows another connecting structure where solder land part 9c is formed in advance on the both sides of solder land part 4. In the connecting structures shown in FIGS. 7, 8, and 9, the connecting position cannot be decided by looking through the through hole 5. Heat for connecting is transmitted easily through enough solder. The connecting process can be properly controlled by using a jig for deciding the connecting position of FPCB 1 and PCB 2.

In FIGS. 6, 7, 8, and 9, a connecting method free from solder layer 8 in PCB 2 shown in each Figure may be possible, if necessary. Although PCB 2 has been described as a rigid type of board, it may be flexible type of PCB.

Thus, FPCB and its connecting method of the present invention has the following effect: making the diameter of through hole 5 in pattern layer 3 smaller than that of layer 11 and base layer 10 increases the connecting area. Then, heat melts solder that spreads through the through hole 5 into topside of solder land part 4 and connects both boards securely and completely. As a result, inexpensive and automatic assemble is realized.

What is claimed:

1. A flexible printed circuit board (FPCB) comprising:
   a through hole defined by a solder land part in a pattern layer disposed between a cover layer and a base layer of said FPCB,
   a diameter of said hole in said pattern layer is smaller than a diameter of a hole defined by said cover layer and a diameter of a hole defined by said base layer in order to increase a connecting area for soldering said FPCB to another printed circuit board,
   said hole in said cover layer and said hole in said base layer corresponds with said solder land part; and
   said FPCB has a suspension layer.

2. The FPCB of claim 1, wherein said FPCB is manufactured by an additive method.

3. The FPCB of claim 1 wherein a ratio between said diameter of said through hole in said pattern layer and said hole in said cover layer and said base layer is about 1 to 1.6.

4. The FPCB of claim 1, wherein a thickness of said solder land part in said FPCB is equal to a total thickness of said pattern layer, said cover layer and said base layer.

5. The FPCB of claim 1, wherein a thickness of said solder land part in said FPCB is equal to a total thickness of said pattern layer and at least one of said cover layer or said base layer.

6. A flexible printed circuit board (FPCB) which has a through hole defined by a solder land part in a pattern layer disposed between a cover layer and a base layer, orienting said FPCB and a printed circuit board (PCB) in a predetermined direction, said FPCB used in performing a connecting method comprising the steps of:
   forming protrusive solder layer on said solder land part in said PCB in advance;
   engaging said protrusive solder layer in said PCB with said through hole in said FCPB wherein a diameter of said though hole in said pattern layer is formed smaller than a diameter of said hole in said cover layer and said hole in said base layer; and
   heating said protrusive solder layer over a solder melting temperature.

7. The FPCB of claim 6, wherein protrusive layer is formed on solder land part on at least one side of pattern layer in said FPCB.

8. A method for connecting a flexible printed circuit board (FPCB) to another printed circuit board which faces toward said FPCB, wherein diameter of a through hole defined by a pattern layer is formed smaller than a diameter of a hole defined by a cover layer and a hole defined by a base layer, the method comprising the steps of:
   forming a protrusive solder layer on at least one side of said solder land part in said FPCB;
   forming a second protrusive solder layer on said solder land part on said PCB;
   engaging said protrusive solder layer of said PCB with said through hole of said FPCB; and
   connecting said FPCB and said PCB together by heating said protrusive solder layer of either said FPCB or said PCB over a solder melting temperature.

* * * * *